(12) United States Patent
Baek

(10) Patent No.: US 8,218,346 B2
(45) Date of Patent: Jul. 10, 2012

(54) MULTI-CHIP PACKAGES INCLUDING EXTRA MEMORY CHIPS TO DEFINE ADDITIONAL LOGICAL PACKAGES AND RELATED DEVICES

(75) Inventor: Hyunggil Baek, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 217 days.

(21) Appl. No.: 12/727,303

(22) Filed: Mar. 19, 2010

(65) Prior Publication Data
US 2010/0238696 A1 Sep. 23, 2010

(30) Foreign Application Priority Data
Mar. 20, 2009 (KR) ........................ 10-2009-0024019

(51) Int. Cl.
*G11C 5/06* (2006.01)
(52) U.S. Cl. ... 365/63; 365/51; 365/189.04; 365/230.05
(58) Field of Classification Search .................... 365/63, 365/51, 189.04, 230.05
See application file for complete search history.

(56) References Cited

U.S. PATENT DOCUMENTS

| | | | | |
|---|---|---|---|---|
| 6,392,292 | B1 * | 5/2002 | Morishita | 257/686 |
| 6,414,384 | B1 * | 7/2002 | Lo et al. | 257/685 |
| 6,992,395 | B2 * | 1/2006 | Fukasawa | 257/777 |
| 7,102,905 | B2 * | 9/2006 | Funaba et al. | 365/51 |
| 2004/0130036 | A1 | 7/2004 | Owaki et al. | |
| 2005/0263873 | A1 * | 12/2005 | Shoji | 257/698 |

FOREIGN PATENT DOCUMENTS

| | | |
|---|---|---|
| JP | 2001-024151 | 1/2001 |
| JP | 2004-179442 | 6/2004 |
| KR | 1020010066902 A | 7/2001 |
| KR | 1020040047607 A | 6/2004 |
| KR | 1020070018331 A | 2/2007 |

* cited by examiner

*Primary Examiner* — Pho M Luu
(74) *Attorney, Agent, or Firm* — Myers Bigel Sibley & Sajovec, P.A.

(57) ABSTRACT

A packaged integrated circuit device includes a primary chip stack and a secondary chip stack. The primary chip stack includes memory chips therein that define a logical package addressable by a memory controller. The secondary chip stack includes fewer memory chips than the primary chip stack. The memory chips of the secondary chip stack are configured to be electrically connected to memory chips of at least one external device package to define an additional logical package addressable by the memory controller. The additional logical package may include a same number of memory chips as the primary chip stack.

21 Claims, 7 Drawing Sheets

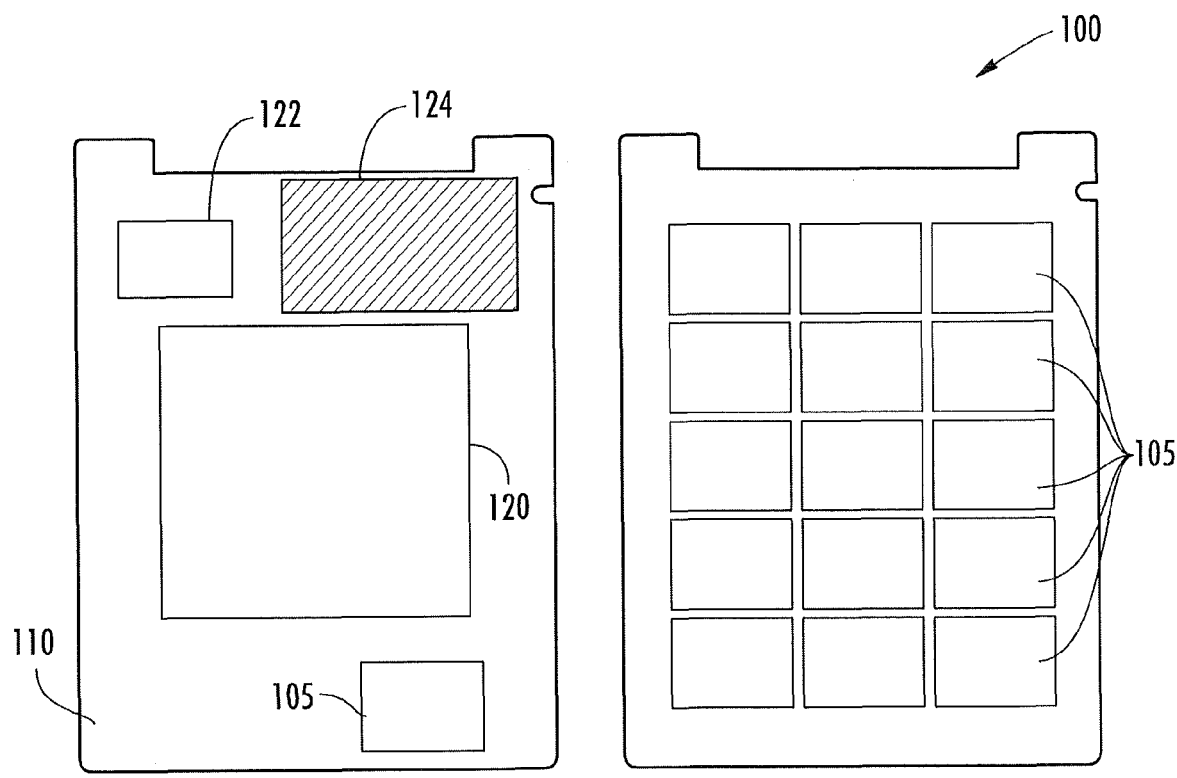
FIG. 1A
PRIOR ART
FIG. 1B
PRIOR ART
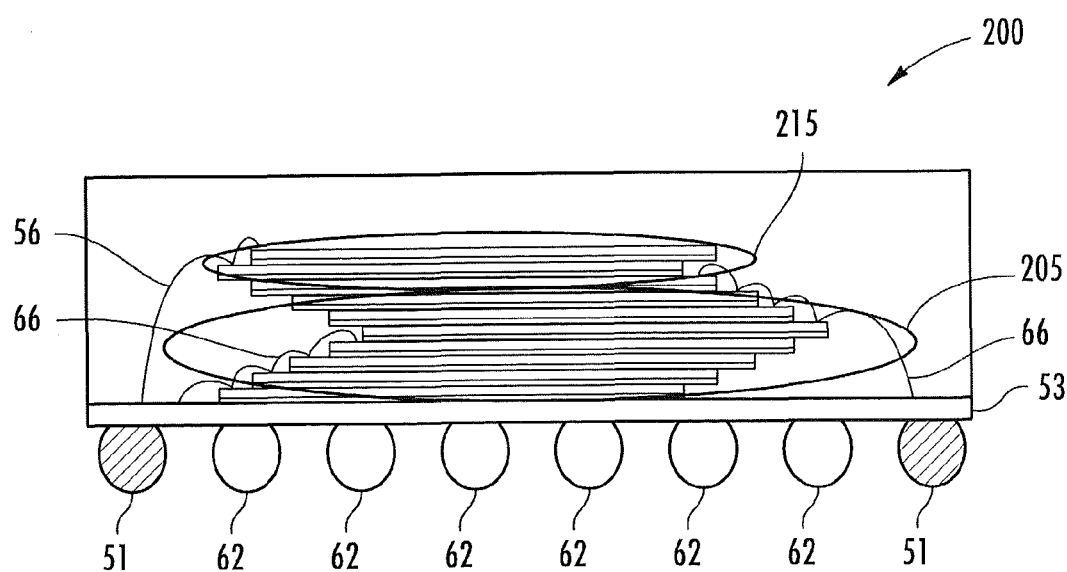
FIG. 2

MULTI-CHIP PACKAGES INCLUDING EXTRA MEMORY CHIPS TO DEFINE ADDITIONAL LOGICAL PACKAGES AND RELATED DEVICES

CROSS-REFERENCE TO RELATED APPLICATION

This U.S. non-provisional patent application claims priority under 35 U.S.C. §119 from Korean Patent Application No. 10-2009-0024019 filed on Mar. 20, 2009, the disclosure of which is hereby incorporated by reference herein in its entirety.

BACKGROUND

The present inventive concept relates to integrated circuit devices, and, in particular, to integrated circuit memory devices.

Memory density has been constantly increasing to keep up with the rapid developments and ever-increasing demands of modern digital technology. In particular, as electronic devices become smaller and smaller, it may be important to provide higher memory densities in such compact devices.

As the prices of non-volatile memory have decreased in recent years, solid state drives (SSDs) have been increasingly used in computer systems and portable devices. SSDs may use non-volatile memory to store data, and may offer several advantages (such as increased speed) over hard disk drives. FIGS. 1A and 1B illustrate the layout of a typical SSD 100. In particular, FIG. 1A illustrates a first side of the SSD 100, while FIG. 1B illustrates a second side of the SSD 100. As shown in FIGS. 1A and 1B, the printed circuit board (PCB) 110 in a SSD may include a buffer memory 122, an interface 124, and plurality of multi-chip memory packages (MCPs) 105. The MCPs 105 are electrically connected to a memory controller 120. The memory controller 120 is configured to control $2^n$ chips, where n is the number of address bits. As such, each of the packages 105 includes $2^n$ chips. The memory density of the SSD may be doubled with each additional address bit.

While current mass production technologies and fabrication methods are continuously developing, a typical MCP may include 8-chip or 16-chip stacks. For example, as shown in FIGS. 1A and 1B, each of the MCPs 105 includes 8 chips, and the PCB 110 is configured to hold 16 of the MCPs 105. However, due to various problems, such as low yields, it may be difficult to stack more than about 16 chips in a package using current mass production techniques.

SUMMARY

According to some embodiments of the present inventive concept, a packaged integrated circuit device includes a primary chip stack and a secondary chip stack. The primary chip stack includes memory chips therein that define a logical package addressable by a memory controller. The secondary chip stack includes fewer memory chips than the primary chip stack. The memory chips of the secondary chip stack are configured to be electrically connected to secondary memory chips of at least one external device package to define an additional logical package addressable by the memory controller.

In some embodiments, the additional logical package may consist of a same number of memory chips as the primary chip stack.

In some embodiments, the packaged integrated circuit device may include a package substrate. The package substrate may include the primary and secondary chip stacks on a first surface thereof, and a plurality of electrical terminals on a second surface of the package substrate opposite the first surface. The chips of the primary chip stack may be electrically connected to first ones of the plurality of electrical terminals, and the chips of the secondary chip stack may be electrically connected to second ones of the plurality of electrical terminals. The second ones of the plurality of electrical terminals may be configured to be electrically connected to corresponding terminals of the at least one external device package to define the additional logical package. For example, the second ones of the plurality of electrical terminals may be provided along edge portions of the substrate.

In some embodiments, the plurality of electrical terminals may be connected to a via portion extending through the package substrate from the second surface to the first surface, and may land at a ball land portion on the second surface of the package substrate and electrically connected to the via portion through a routing line on the second surface of the package substrate.

In some embodiments, primary bonding wires may electrically connect the chips of the primary chip stack to the first ones of the plurality of electrical terminals, and secondary bonding wires may electrically connect the chips of the secondary chip stack to the second ones of the plurality of electrical terminals.

In some embodiments, the primary chip stack may include a first and a second conductive via structure vertically extending through the memory chips thereof. The first conductive via structure may extend through the memory chips of the primary chip stack, and may electrically connect the memory chips of the primary chip stack to the first ones of the plurality of electrical terminals. The second conductive via structure may extend through the memory chips of the primary chip stack, and may electrically connect the memory chips of the secondary chip stack to the second ones of the plurality of electrical terminals. In some embodiments, at least one of the memory chips of the secondary chip stack may further include a redistribution line on the chips of the secondary chip stack electrically connecting a conductive chip pad thereon to the second conductive via structure located at a different position spaced apart from the first conductive via structure on the primary chips.

In some embodiments, the memory chips of the primary chip stack and the memory chips of the secondary chip stack may be electrically connected to a common power and/or ground terminal.

In some embodiments, the memory chips of the primary chip stack and the memory chips of the additional logical package may be individually addressable using is address bits. The primary chip stack may consist of $2^n$ memory chips, and the secondary chip stack may consist of $2^n$-1 chips memory chips or less.

In some embodiments, the packaged integrated circuit device may be a lead frame package including a substrate therein and the primary and secondary chip stacks on the substrate, a primary lead terminal, a secondary lead terminal electrically isolated from the primary lead terminal, a primary bonding wire electrically connecting the chips of the primary chip stack to the primary lead terminal, and a secondary bonding wire electrically connecting the chips of the secondary chip stack to the secondary lead terminal.

In some embodiments, at least one of the chips of the primary and/or secondary chip stacks may be provided on opposite surfaces of the substrate.

In some embodiments, a molding compound may encapsulate the primary and secondary chip stacks.

According to further embodiments of the present inventive concept, a data storage device includes a plurality of multi-chip packages. Each of the plurality of multi-chip packages includes a primary chip stack and a secondary chip stack having fewer memory chips than the primary chip stack. The primary chip stacks each define a logical package addressable by a memory controller. The secondary chip stacks collectively define an additional logical package addressable by the memory controller.

In some embodiments, the additional logical package may consist of a same number of memory chips as at least one of the primary chip stacks.

In some embodiments, each of the plurality of multi-chip packages may include a package substrate including the primary and secondary chip stacks on a first surface thereof, a first plurality of electrical terminals on a second surface of the package substrate opposite the first surface, and a second plurality of electrical terminals on the second surface of the package substrate electrically isolated from the first plurality of electrical terminals. The chips of the primary chip stack may be electrically connected to ones of the first plurality of electrical terminals, and the chips of the secondary chip stack may be electrically connected to ones of the second plurality of electrical terminals.

In some embodiments, the data storage device may further include a motherboard including the plurality of multi-chip packages thereon. The motherboard may include conductive traces configured to electrically connect corresponding ones of the second plurality of electrical terminals of each of the plurality of multi-chip packages to collectively define the additional logical package.

In some embodiments, the data storage device may further include a memory controller configured to individually address the memory chips of the primary chip stack in each of the plurality of multi-chip packages. The memory controller may also be configured to individually address the memory chips of the additional logical package collectively defined by the secondary chip stacks. For example, the controller may be configured to individually address the memory chips of each primary chip stack and individually address the memory chips of the additional logical package using n address bits, where each of the primary chip stacks may consist of $2^n$ memory chips, and where each of the secondary chip stacks may consist of $2^n-1$ memory chips or less.

In some embodiments, the data storage device may further include at least one additional multi-chip package. The additional multi-chip package may include a chip stack including the same number of memory chips as each primary chip stack, such that the memory chips of the additional multi-chip package may be addressable using the n address bits.

In some embodiments, the memory chips of the primary and secondary chip stacks may be flash memory, dynamic random access memory (DRAM), phase-changeable random access memory (PRAM), magnetic random access memory (MRAM), or resistive random access memory (RRAM).

In some embodiments, the data storage device may be a solid state drive (SSD).

In some embodiments, the data storage device may be included in a memory unit of an electronic system. The electronic system may further include a processor, an input/output unit, and a bus that communicatively couples the processor, the memory, and the input/output unit.

Other elements and/or devices according to some embodiments will become apparent to one with skill in the art upon review of the following drawings and detailed description. It is intended that all such additional devices, in addition to any combination of the above embodiments, be included within this description, be within the scope of the inventive concept, and be protected by the accompanying claims.

BRIEF DESCRIPTION OF THE DRAWINGS

FIGS. 1A and 1B are block diagrams illustrating the layout of a typical solid state drive (SSD).

FIG. 2 is a cross-sectional view illustrating a packaged integrated circuit device according to some embodiments of the present inventive concept.

DETAILED DESCRIPTION OF EMBODIMENTS

Figure 3A:
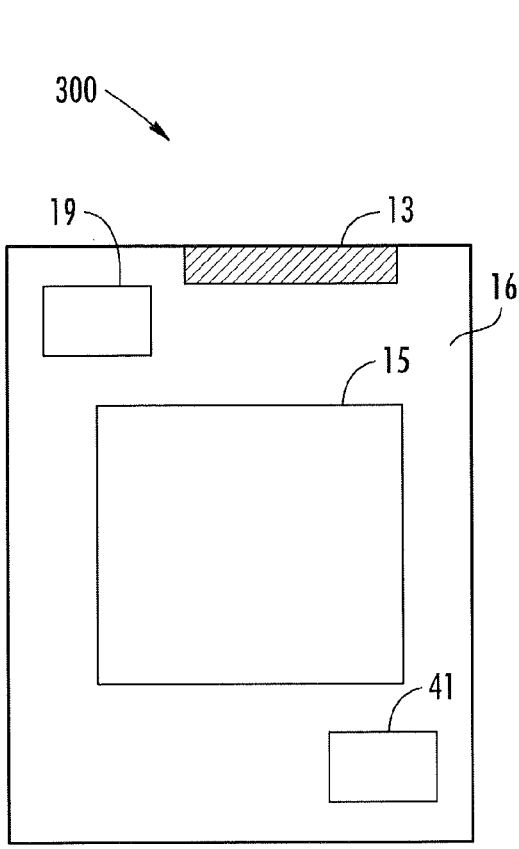
FIGS. 3A and 3B are plan views illustrating a layout of first and second sides of a data storage device including packaged integrated circuit devices according to some embodiments of the present inventive concept.

The present inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third, primary, secondary, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first or primary element, component, region, layer or section discussed below could be termed a second or secondary element, component, region, layer or section without departing from the teachings of the present inventive concept.

Spatially relative terms, such as "beneath", "below", "lower", "under", "above", "upper," "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" or "over" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, and may be abbreviated as "/".

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Embodiments of the inventive concept are described herein with reference to cross-section illustrations that are schematic illustrations of idealized embodiments (and intermediate structures) of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Some embodiments of the present inventive concept provide a multi-chip package (MCP) including a primary stack of chips that are addressable by a memory controller using n address bits (where is an integer), and a secondary stack of chips and having fewer chips than the primary stack. For example, the primary stack of chips may include N chips (where $N=2^n$), and the secondary stack of chips may include M chips (where $M=2^n-1$ or less). The secondary stacks of two or more MCPs may be electrically connected or "grouped" to define an additional MCP that is addressable by the memory controller, for example, using the n address bits. Accordingly, a multi-chip package including N+M chips may allow for memory modules with increased package density and/or reduced size as compared to conventional memory modules having comparable memory densities.

FIG. 2 illustrates a MCP 200 according to some embodiments of the present inventive concept in cross-section. Referring now to FIG. 2, the MCP 200 includes a primary chip stack 205 and a secondary chip stack 215 having fewer chips than the primary chip stack 205. For example, the primary chip stack 205 may have N chips, which may be individually addressed by a memory controller using n address bits in a manner similar to that of conventional multi-chip packages. The secondary chip stack 215 may have M chips, where M is less than N. The M chips of the secondary chip stack 205 are configured to be electrically connected to memory chips of at least one external device package to define an additional logical package that is addressable by the same memory controller used to address the N chips of the primary chip stack 205. In some embodiments, the additional logical package may include a same number of chips as the primary chip stack 205. For example, the additional logical package may include several groups of M chips to provide N total chips, such that the chips of the additional logical package may be individually addressed using the same number of address bits (e.g., n address bits) used to address the N chips of the primary chip stack 205. As such, the secondary chip stacks 215 of several MCPs may be electrically grouped together to provide one or more "virtual" packages including the same number of chips as the primary chip stack 205 in each MCP. The primary and secondary chip stacks 205 and 215 of the MCP 200 may be provided on a common package substrate 53, and bonding wires 66 and 56 may be used to connect the chips of the primary chip stack 205 and the secondary chip stack 215 to electrical terminals 62 and 51, respectively. The terminals 62 and 51 are configured to conduct electrical signals between the chips of the MCP 200 and a printed circuit board on which the MCP is placed or mounted.

Figure 3B:
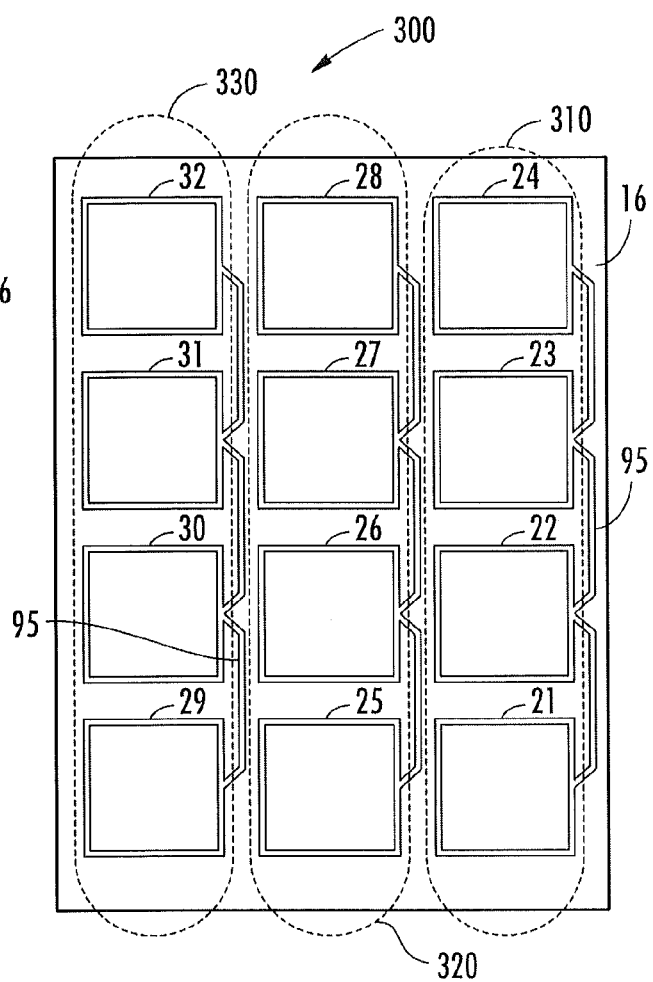
Figure 3C:
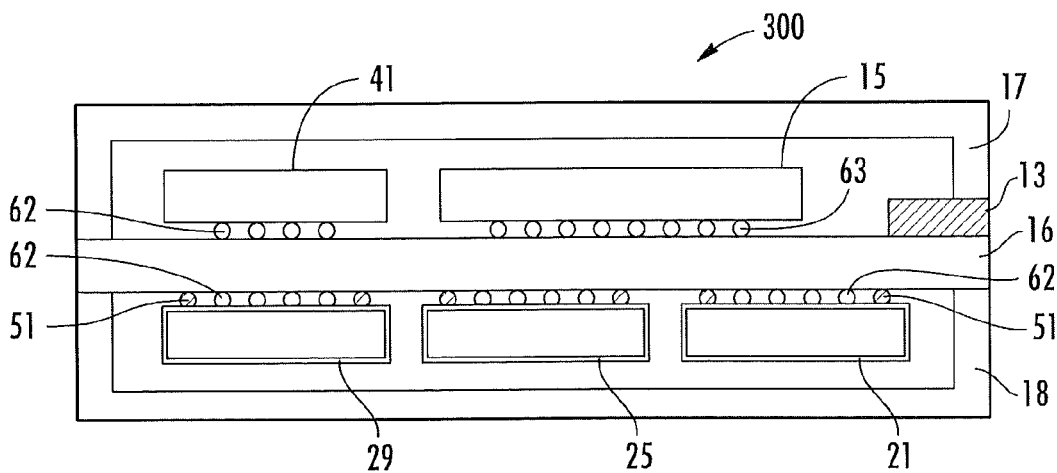
FIG. 3C is a cross-sectional view illustrating the data storage device of FIGS. 3A and 3B.

FIGS. 3A and 3B are plan views respectively illustrating first and second sides of a data storage device 300 including several MCPs according to some embodiments of the present inventive concept, while FIG. 3C is a cross-sectional view of the data storage device 300. The data storage device 300 may be a solid state drive (SSD) in some embodiments. As shown in FIGS. 3A and 3C, the data storage device 300 includes a memory controller 15, a buffer memory 19, a MCP 41, and an I/O(Input/Output) interface 13 (such as a serial ATA (SATA) interface) on a first side 17 of a main PCB or motherboard 16. The PCB 16 includes conductive pads (not shown) in a pattern that matches the electrical terminals 63 and 62 of the memory controller 15 and the buffer memory 19, respectively, such that the terminals 63 and 62 respectively provide electrical connections to the memory controller 15 and the MCP 41. As shown in FIGS. 3B and 3C, the second side 18 of the PCB 16 includes a plurality of multi-chip packages 21-32. Each of the MCPs 21-32 may be similar to the MCP 200 described above with reference to FIG. 2. In particular, in the embodiments of FIGS. 3A-3C, each of the MCPs 21-32 includes a primary chip stack including eight (8) chips, and a secondary chip stack including two (2) chips. As such, each of the MCPs 21-32 includes a total of 10 chips (e.g., 8 chips in the primary stack and 2 chips in the secondary stack). The PCB 16 includes conductive pads (not shown) in a pattern that matches the electrical terminals 62 and 51 of the MCPs 21-32, such that the electrical terminals 62 provide electrical connections to the primary chip stacks of each MCP 21-32, while the electrical terminals 51 provide electrical connections to the secondary chip stacks of each MCP 21-32. The eight (8) chips of each primary chip stack define a logical package that is addressable by the memory controller 15.

Still referring to FIGS. 3A-3C, the PCB 16 includes conductive traces 95 that are configured to electrically connect the two (2) chips in the secondary chip stacks of the MCPs 21-32 in groups of four (4) to provide three (3) additional logical packages 310, 320, and 330 that are addressable by the controller 15. In particular, the conductive traces 95 connect the electrical terminals 51 of ones of the MCPs 21-32 to define the three additional logical packages 310, 320, and 330, each including eight (8) chips (e.g., 2 chips from each secondary chip stack of the 4 MCPs connected by the conductive lines 95). In particular, as shown in FIG. 3B, the secondary chip stacks of MCPs 21-24 define the additional logical package 310, the secondary chip stacks of MCPs 25-28 define the additional logical package 320, and the secondary chip stacks of MCPs 29-32 define the additional logical package 330. As such, using 3 address bits, the memory controller 15 can individually address the 8 chips in the primary chip stack of each of the MCPs 21-32. Likewise, the memory controller 15 can individually address the 8 chips of each additional logical package collectively defined by the secondary chip stacks of the MCPs 21-24, 25-28, and 29-32, using the same number of address bits. In some embodiments, the MCP 41 may also be an 8-chip package that is addressable by the memory controller 15 using 3 address bits.

Accordingly, in the embodiments of FIGS. 3A-3C, the controller 15 may be configured to control a total of 16 logical packages (e.g., the 12 logical packages respectively defined by the primary chip stacks of the MCPs 21-32, the 3 additional logical packages collectively defined by the secondary chip stacks of the MCPs 21-32, and the 1 logical package provided by the chips of the MCP 41) that occupy the footprint of only 13 physical packages (e.g., the 12 MCPs 21-32, and the MCP 41) on the PCB 16. In contrast, a conventional data storage device may require 16 physical packages, each including 8 chips, to provide the same amount of memory storage.

Figure 4A:
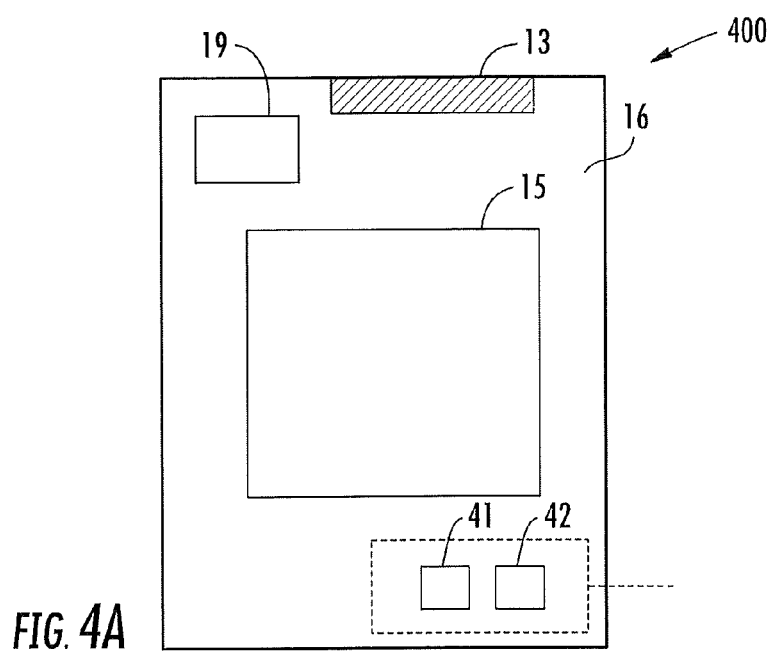
FIGS. 4A and 4B are plan views illustrating a layout of first and second sides of a data storage device including packaged integrated circuit devices according to further embodiments of the present inventive concept.
Figure 4B:
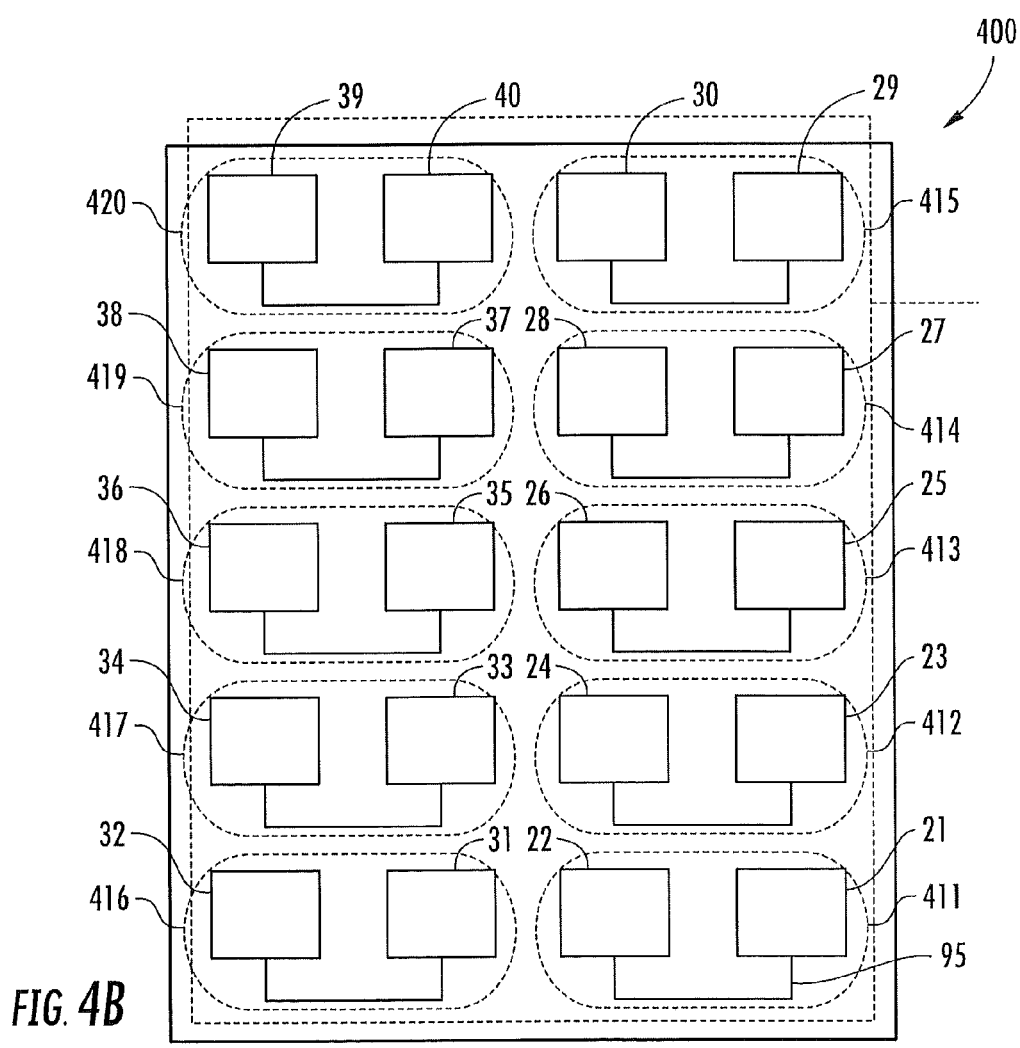

FIGS. 4A and 4B are plan views respectively illustrating first and second sides of a data storage device 400, such as a SSD, including several MCPs according to further embodiments of the present inventive concept. As shown in FIG. 4A, the data storage device 400 includes a memory controller 15, a buffer memory 19, MCPs 41 and 42, and an I/O interface 13 (such as an SATA interface) on a first side of a main PCB or motherboard 16. As shown in FIG. 4B, the second side of the PCB 16 includes a plurality of multi-chip packages 21-40. Each of the MCPs 21-40 may be similar to the MCP 200 described above with reference to FIG. 2. In particular, in the embodiments of FIGS. 4A and 4B, each of the MCPs 21-40 includes a primary chip stack including eight (8) chips, and a secondary chip stack including four (4) chips. As such, each of the MCPs 21-40 includes 12 chips (e.g., 8 chips in the primary stack and 4 chips in the secondary stack). The eight (8) chips of each primary chip stack define a logical package that is addressable by the memory controller 15.

Still referring to FIGS. 4A and 4B, the PCB 16 includes conductive traces 95 that are configured to electrically connect the four (4) chips in the secondary chip stacks of the MCPs 21-40 in groups of two (2) to provide ten (10) additional logical packages 411-420 that are addressable by the controller 15. The additional logical packages 411-420 each include 8 chips (e.g., 4 chips from each secondary chip stack of the 2 MCPs connected by the conductive lines 95). In particular, as shown in FIG. 4B, the secondary chip stacks of MCPs 21-22 define the additional logical package 411, the secondary chip stacks of MCPs 23-24 define the additional logical package 412, the secondary chip stacks of MCPs 25-26 define the additional logical package 413, the secondary chip stacks of MCPs 27-28 define the additional logical package 414, and the secondary chip stacks of MCPs 29-30 define the additional logical package 415. Likewise, the secondary chip stacks of MCPs 31-32 define the additional logical package 416, the secondary chip stacks of MCPs 33-34 define the additional logical package 417, the secondary chip stacks of MCPs 35-36 define the additional logical package 418, the secondary chip stacks of MCPs 37-38 define the additional logical package 419, and the secondary chip stacks of MCPs 39-40 define the additional logical package 420. As such, using 3 address bits, the memory controller 15 can individually address the 8 chips in the primary chip stack of each of the MCPs 21-40, as well as the 8 chips of each additional logical package defined by the secondary chip stacks of MCPs 21-22, 23-24, 25-26, 27-28, 29-30, 31-32, 33-34, 35-36, 37-38, and 39-40, using the same number of address bits. In some embodiments, the MCPs 41 and 42 may each include 8 chips, which are also addressable by the memory controller 15 using the same number of address bits.

Accordingly, the controller 15 may be configured to control a total of 32 logical packages (e.g., the 20 logical packages defined by the primary chip stacks of the MCPs 21-40, the 10 additional logical packages defined by the secondary chip stacks of the MCPs 21-40, and the 2 logical packages provided by the MCPs 41-42) that occupy the footprint of only 22 physical packages (e.g., the 20 multi-chip packages 21-32, and the 2 multi-chip packages 41-42) on the PCB 16. In contrast, a conventional data storage device may require 32 physical packages, each including 8 chips, to provide the same amount of memory storage. As such, data storage devices according to some embodiments of the present inventive concept may use fewer physical packages to provide the same memory storage capacity, and thus, may offer reduced costs and/or allow for a smaller form factor than conventional devices.

Figure 5A:
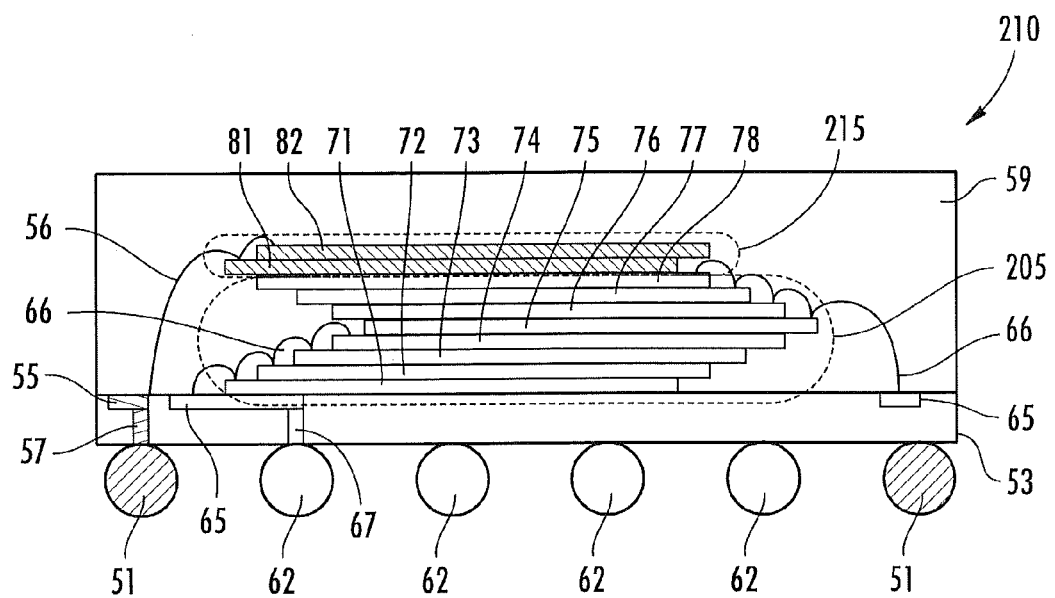
FIG. 5A is a cross-sectional view illustrating a packaged integrated circuit device according to some embodiments of the present inventive concept.
Figure 5B:
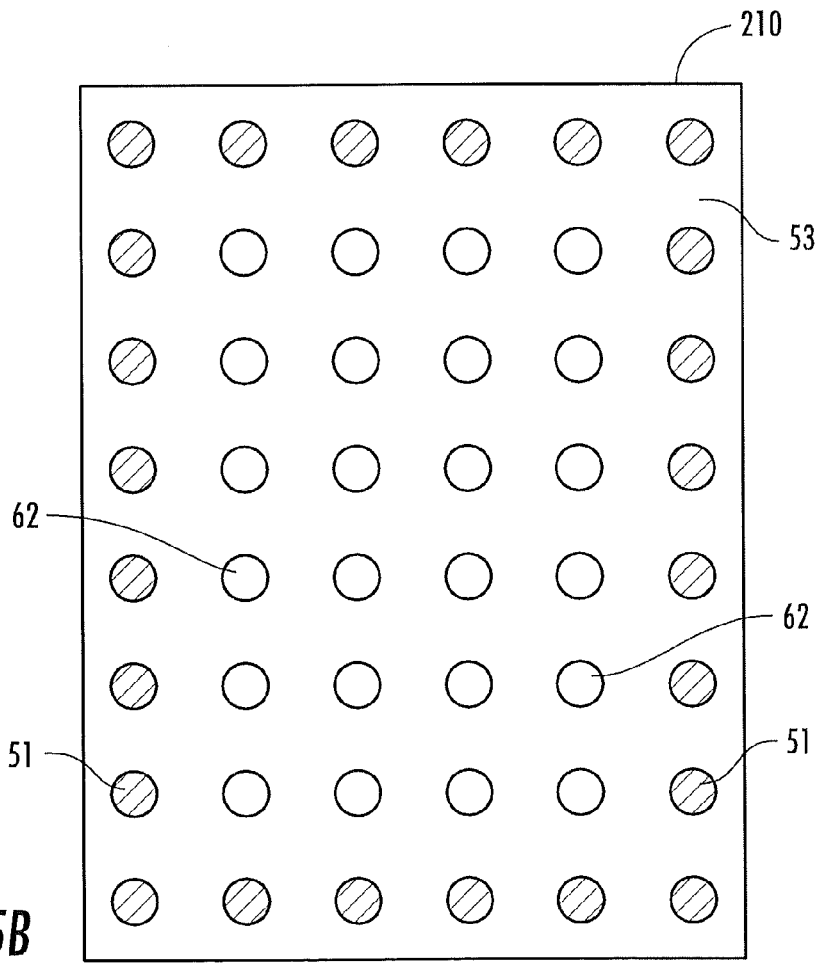
FIG. 5B is a plan view illustrating the packaged integrated circuit device of FIG. 5A.

FIG. 5A is a cross-sectional view illustrating a MCP 210 according to some embodiments of the present inventive concept, while FIG. 5B illustrates the MCP 210 in plan view. As shown in FIG. 5A, the multi-chip ball grid array (BGA) package 210 includes a primary chip stack 205 and a secondary chip stack 215 on a first surface of a package substrate 53. A molding compound 59, such as an epoxy molding compound (EMC), encapsulates the primary and secondary chip stacks 205 and 215. The primary chip stack 205 includes 8 chips 71-78, and the secondary chip stack 215 includes 2 chips 81-82. Primary bonding wires 66 electrically connect the chips 71-78 of the primary chip stack 205 to primary bond traces or fingers 65 on the substrate 53, while secondary bonding wires 56 electrically connect the chips 81-82 of the secondary chip stack 215 to secondary bond traces or fingers 55 on the substrate 53. The primary bond fingers 65 are electrically connected to one or more electrical terminals 62 on a second surface of the substrate 53, and the secondary bond fingers 55 are electrically connected to one or more electrical terminals 51 on the second surface of the substrate 53. In the BGA package 210 of FIG. 5A, via portions 67 extend through the substrate 53 to electrically connect the primary bond fingers 65 to the BGA terminals 62, and via portions 57 extend through the substrate 53 to electrically connect the secondary bond fingers 55 to the BGA terminals 51.

Referring now to FIG. 5B, the terminals 62 and 51 on the second side of the substrate 53 are configured to electrically connect the chips of the primary and secondary chip stacks 205 and 215 to a memory controller and/or other devices. The terminals 62 that provide connections to the memory chips 71-78 of the primary chip stack 205 are separated from the terminals 51 that provide connections to the memory chips 81-82 of the secondary chip stack 215. In particular, as shown in FIG. 5B, the terminals 51 are provided along edge portions of the substrate 53, for example, to allow for ease of connection of the memory chips 81-82 of the secondary chip stack 215 to the secondary chip stacks of other external device packages. However, other configurations and/or arrangements that provide separation between the terminals 51 and 62 may also be used. The memory chips 71-78 of the primary chip stack 205 and the memory chips 81-82 of the secondary chip stack 215 may also be electrically connected to a common power and/or ground terminal in some embodiments.

Figure 6:
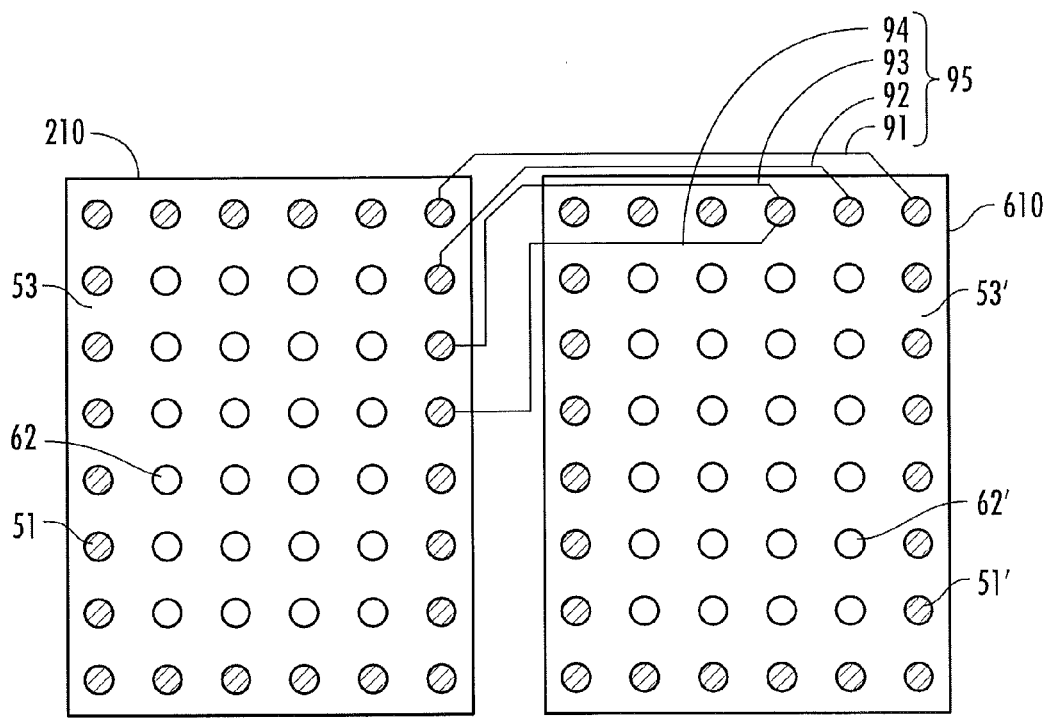
FIG. 6 is a plan view illustrating connections between terminals of packaged integrated circuit devices according to some embodiments of the present inventive concept.

FIG. 6 illustrates the MCP 210 of FIGS. 5A-5B and an external packaged integrated circuit device connected thereto in plan view to show the connections therebetween. In particular, as shown in FIG. 6, the terminals 51 of the MCP 210 are provided along edge portions of the substrate 53 and are electrically connected to corresponding terminals 51' of another MCP 610 by conductive traces 91-94. The traces 91-94 may collectively correspond to the conductive traces 95 illustrated in FIGS. 3B and/or 4B. The positioning of the terminals 51 and 51' along edge portions of their respective substrates 53 and 53' may facilitate routing of the traces 91-94 on the motherboard on which the MCPs 210 and 610 are mounted, such as the PCB 16 of FIGS. 3A-4B. The MCP 610 may include a primary chip stack (including 8 chips) and a secondary chip stack (including 2 chips) on a package substrate 53', and may be similar or identical to the MCP 210. However, in some embodiments, the primary and/or secondary chip stacks of the MCP 610 may include fewer or more chips than those of the MCP 210. As such, the secondary chip stack 215 of the MCP 210 may be electrically connected to the secondary chip stack of the MCP 610 and/or the secondary chip stacks of one or more other external integrated circuit device packages by the conductive traces 95 such that the secondary chip stacks of multiple MCPs collectively define one or more additional logical packages. The additional logical package(s) may be addressable by the same memory controller used to address the logical packages defined by the chips of the primary chip stacks in each MCP. Also, in some embodiments, the additional logical packages may each include the same number of memory chips as the logical package defined by the primary chip stack of each MCP; thus, the controller may address the additional logical package(s) and the primary chip stacks using the same number of address bits.

Figure 7:
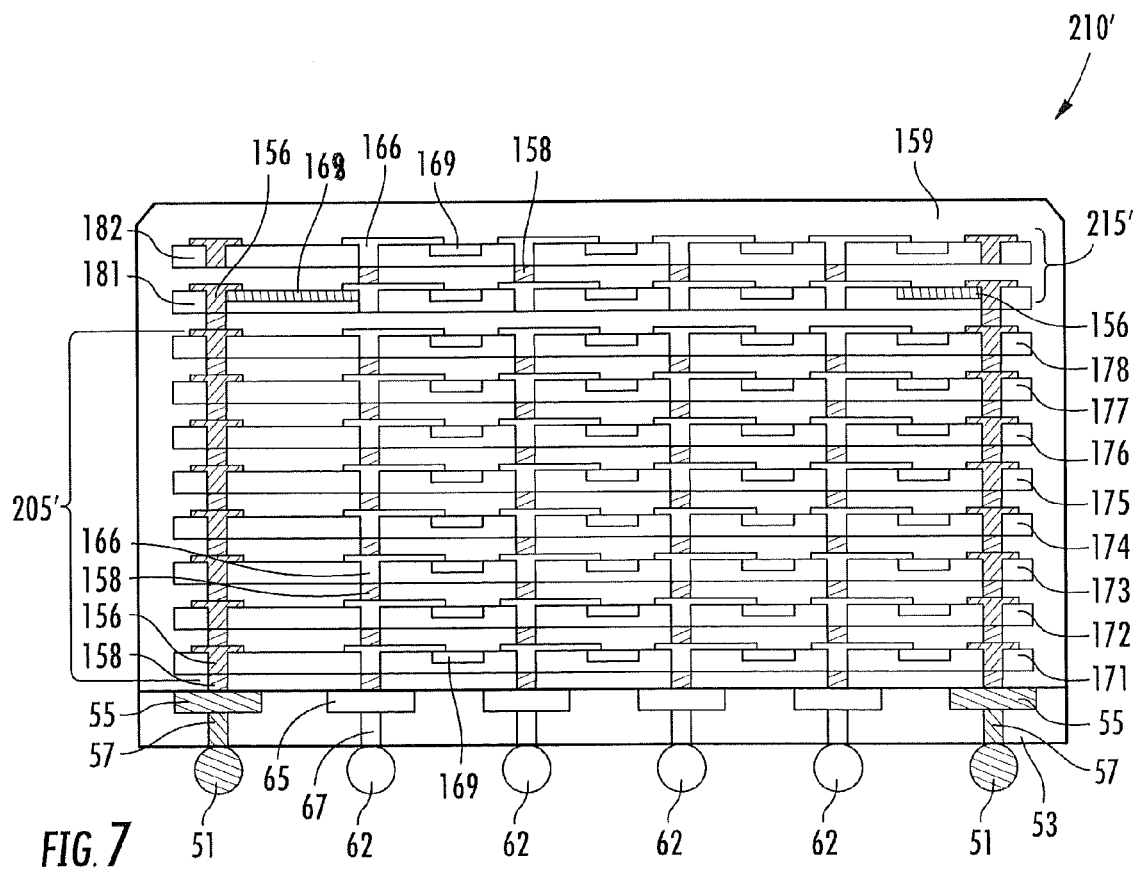
FIG. 7 is a cross-sectional view illustrating a packaged integrated circuit device according to further embodiments of the present inventive concept.

FIG. 7 illustrates a packaged integrated circuit device according to further embodiments of the present inventive concept in cross-section. In particular, as shown in FIG. 7, BGA package 210' includes a primary chip stack 205' and a secondary chip stack 215' on a first surface of a package substrate 53. A molding compound 159 encapsulates the primary and secondary chip stacks 205' and 215'. The primary conductive via structures are the via structures electrically interconnecting memory chips 171-178 of the primary chip stack 205', and the secondary conductive via structures are the via structures electrically interconnecting memory chips 181-182 of the secondary chip stack 215'. The secondary conductive via structures may be positioned in the chips of the primary chip stack 205' to provide electrical separation from chip pads 169 of primary chip stack 205'. Also, the conductive via structures may be classified as first-positioned vias 166 and second-positioned vias 156 according to their respective positions on the chips. The first and second-positioned vias 166 and 156 in the chips of the primary chip stack 205' extend through the eight (8) memory chips 171-178 of the primary chip stack 205'. The first-positioned vias 166 in the chips of the primary chip stack 205' electrically connect conductive chip pads 169 on the memory chips 171-178 of the primary chip stack 205' to the electrical terminals 62 on the opposite side of the substrate 53. Likewise, the second-positioned vias 156 electrically connect conductive chip pads 169 on the two (2) memory chips 181-182 of the secondary chip stack 215' to the electrical terminals 51. In particular, primary bonding fingers 65 and via portions 67 electrically connect the first-positioned vias 166 in primary chips to the terminals 62, while secondary bonding fingers 55 and via portions 57 electrically connect the second-positioned vias 156 to the terminals 51. The terminals 62 (which provide connections to the memory chips 171-178 of the primary chip stack 205') may be provided in an arrangement that separates the terminals 62 from the terminals 51 (which provide connections to the memory chips 181-182 of the secondary chip stack 215), for example, as illustrated in FIG. 5B. However, the memory chips 171-178 of the primary chip stack 205' and the memory chips 181-182 of the secondary chip stack 215' may be electrically connected to a common power and/or ground terminal in some embodiments.

Still referring to FIG. 7, the first and second-positioned vias 166 and 156 may be through silicon via (TSV) structures in some embodiments. In addition, one or more of the memory chips of the primary and/or secondary chip stacks 205' and 215' include redistribution lines 168. In particular, in FIG. 7, the memory chip 181 of the secondary chip stack 215' includes redistribution lines 168 that electrically connect conductive chip pads 169 of the memory chip 181 to the secondary conductive via structures 156. The redistribution lines 168 may be used to route connections to the conductive chip pads 169 for different arrangements of the first-positioned vias 166 and/or second-positioned vias 156, allowing for different layouts.

Figure 8:
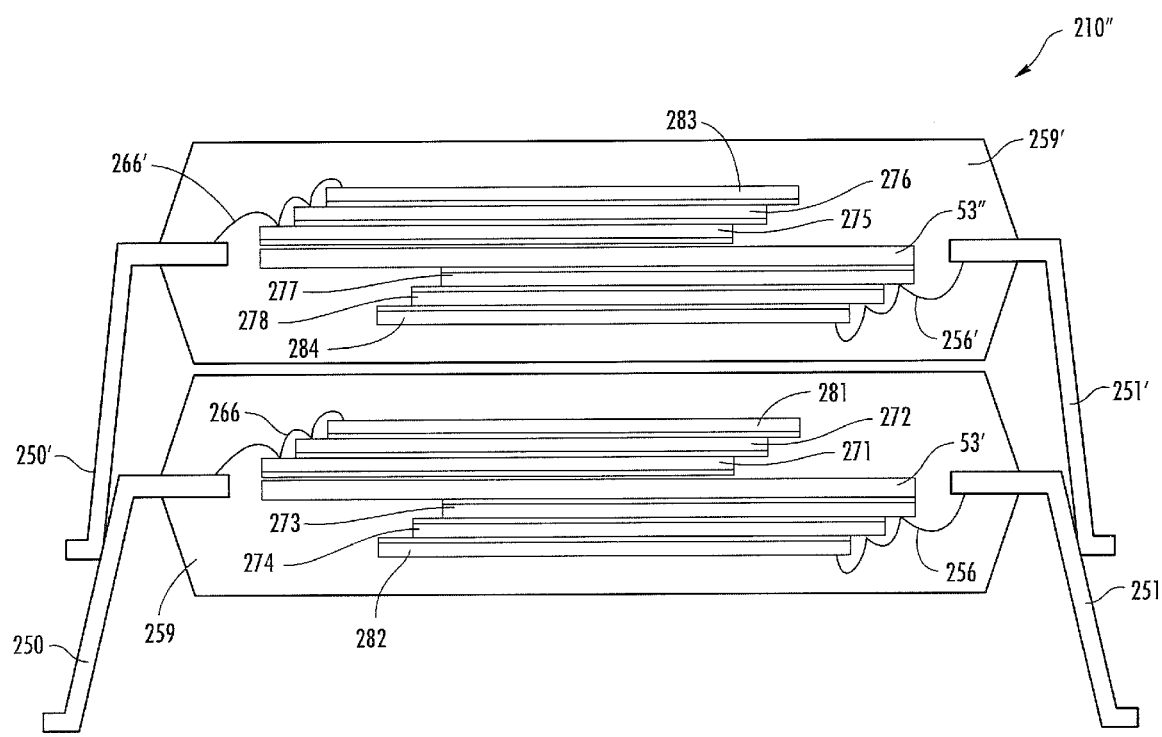
FIG. 8 is a cross-sectional view illustrating a packaged integrated circuit device according to still further embodiments of the present inventive concept.

FIG. 8 illustrates a multi-chip lead frame package 210" according to still further embodiments of the present inventive concept in cross-section. Referring now to FIG. 8, the multi-chip lead frame package 210" is a dual-stack package including first and second substrates 53' and 53". The first substrate 53' includes memory chips 271, 272, and 281 on a first surface thereof and memory chips 273, 274, and 282 on a second surface thereof opposite the first surface encapsulated by a molding compound 259. Similarly, the second substrate 53" includes memory chips 275, 276, and 283 on a first surface thereof and memory chips 277, 278, and 284 on a second surface thereof opposite the first surface encapsulated by a molding compound 259'. Primary bonding wire 266 electrically connects the chips 271-274 on the first substrate 53' to a primary lead terminal 250, while primary bonding wire 266' electrically connects the chips 275-278 on the second substrate 53" to a primary lead terminal 250'. Secondary bonding wire 256 electrically connects the chips 281-282 on the first substrate 53' to a secondary lead terminal 251, while secondary bonding wire 256' electrically connects the chips 283-284 on the second substrate 53" to a secondary lead terminal 251'. Although the bonding wires 256, 256', 266, and 266' are illustrated as providing connections to several chips, it is to be understood that one or more of the chips may include dummy pads that do not provide an electrical connection thereto. Also, although not shown, one or more of the chips may include redistribution lines and/or conductive via structures extending therethrough to provide electrical connections to one of the bonding wires 256, 256', 266, and 266'.

Still referring to FIG. 8, the primary lead terminals 250 and 250' are electrically connected such that the memory chips 271-278 define a primary chip stack including eight (8) chips, which are individually addressable by a controller using three (3) address bits. Likewise, the secondary lead terminals 251 and 251' are electrically connected such that the memory chips 281-284 define a secondary chip stack including four (4) chips. The primary lead terminals 250 and 250' may be electrically isolated from the secondary lead terminals 251 and 251'. The secondary lead terminals 251 and/or 251' may be electrically connected to secondary lead terminals of one or more external chip packages such that the secondary chip stacks of multiple packages collectively define one or more additional logical packages. For example, the additional logical packages may each include eight (8) chips, which are individually addressable by the controller using three (3) address bits. However, in any of the above embodiments, it is to be understood that the additional logical packages need not necessarily include the same number of chips and/or be addressable using the same number of address bits as the primary chip stacks.

Figure 9:
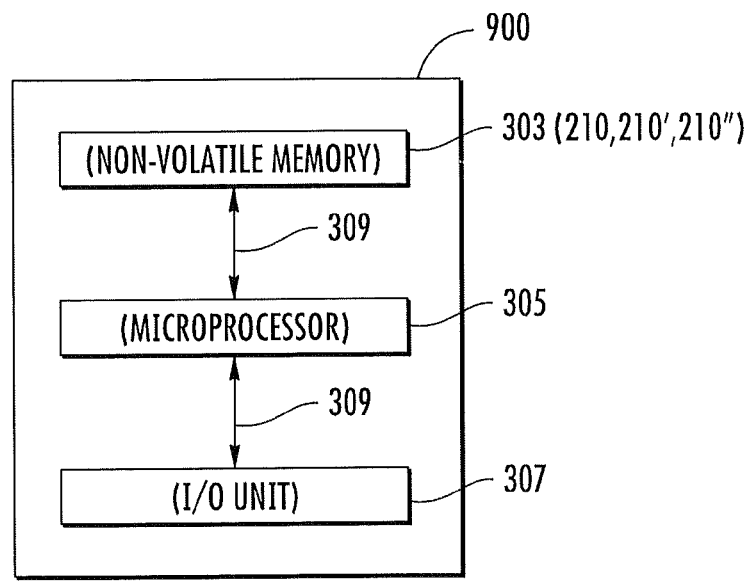
FIG. 9 is a block diagram illustrating an electronic system including data storage devices according to some embodiments of the present inventive concept.

FIG. 9 is a block diagram illustrating an electronic system 900 including data storage devices according to some embodiments of the present inventive concept. As shown in FIG. 9, the system 900 includes a microprocessor 305, an input/output (I/O) unit 307, and a memory storage unit 303. A bus 309 communicatively couples the microprocessor 305, the memory storage unit 303, and the I/O unit 307. The memory storage device 303 includes one or more data storage devices as described above. As such, the memory storage device 303 may include one or more of the MCPs 21-42, 200, 210, 210', and/or 210" described above with reference to FIGS. 2-8.

Figure 10:
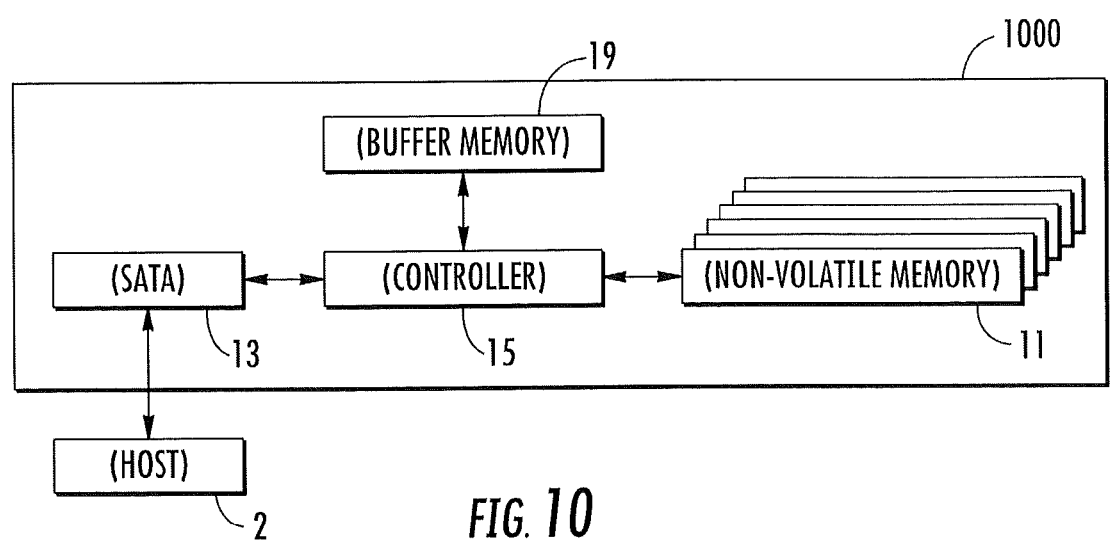
FIG. 10 is a block diagram illustrating a data storage device according to some embodiments of the present inventive concept connected to an external host.

FIG. 10 is a block diagram illustrating a data storage device 1000 according to some embodiments of the present inventive concept connected to an external host. Referring now to FIG. 10, the data storage device 1000 includes a controller 15, a buffer memory 19, an interface 13 (such as a serial ATA interface), which may be similar to those discussed above with reference to FIGS. 3A and 4A. The interface 13 provides communication with an external host device 2. The data storage device 1000 further includes a memory unit 11, which includes one or more of the multi-chip packages described above. In particular, the memory unit 11 may include one or more of the MCPs 21-42, 200, 210, 210', and/or 210" discussed above with reference to FIGS. 2-8. In some embodiments, the data storage device 1000 may be a solid state drive (SSD). However, the data storage device 1000 may be any type of module including a PCB on which a plurality of semiconductor memory elements are mounted.

Embodiments of the present inventive concept may be employed in any electronic devices that use semiconductor-based memory, such as flash memory, dynamic random access memory (DRAM), ferroelectric random access memory (FeRAM), phase-changeable random access memory (PRAM), magnetic random access memory (MRAM), and/or resistive random access memory (RRAM). Examples of such electronic devices include computer systems, mobile/portable devices (such as mobile phones, MP3 players, and navigation systems), and/or household appliances.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

That which is claimed:

1. A packaged integrated circuit device, comprising:
   a primary chip stack comprising memory chips therein that define a logical package addressable by a memory controller; and
   a secondary chip stack comprising fewer memory chips than the primary chip stack, wherein the memory chips of the secondary chip stack are configured to be electrically connected to memory chips of at least one external device package to define an additional logical package addressable by the memory controller.

2. The device of claim 1, wherein the additional logical package consists of a same number of memory chips as the primary chip stack.

3. The device of claim 1, further comprising:
   a package substrate including the primary and secondary chip stacks on a first surface thereof; and
   a plurality of electrical terminals on a second surface of the package substrate opposite the first surface,
   wherein the chips of the primary chip stack are electrically connected to first ones of the plurality of electrical terminals, and wherein the chips of the secondary chip stack are electrically connected to second ones of the plurality of electrical terminals.

4. The device of claim 3, wherein the second ones of the plurality of electrical terminals are configured to be electrically connected to corresponding terminals of the at least one external device package to define the additional logical package.

5. The device of claim 4, wherein the second ones of the plurality of electrical terminals are provided along edge portions of the substrate.

6. The device of claim 3, wherein the plurality of electrical terminals respectively comprise:
   a via portion extending through the package substrate from the second surface to the first surface; and
   a ball portion on the second surface of the package substrate and electrically connected to the via portion.

7. The device of claim 3, further comprising:
   primary bonding wires electrically connecting the chips of the primary chip stack to the first ones of the plurality of electrical terminals; and
   secondary bonding wires electrically connecting the chips of the secondary chip stack to the second ones of the plurality of electrical terminals.

8. The device of claim 3, wherein the primary chip stack comprises:
   a first conductive via structure extending through the memory chips thereof and electrically connecting the memory chips of the primary chip stack to the first ones of the plurality of electrical terminals; and
   a second conductive via structure extending through the memory chips thereof and electrically connecting the memory chips of the secondary chip stack to the second ones of the plurality of electrical terminals.

9. The device of claim 8, wherein at least one of the memory chips of the secondary chip stack further comprises:
 a redistribution line electrically connecting a conductive chip pad thereon to the second conducive via structure.

10. The device of claim 3, wherein the memory chips of the primary chip stack and the memory chips of the secondary chip stack are electrically connected to a common power and/or ground terminal.

11. The device of claim 1, further comprising:
 a substrate including the primary and secondary chip stacks thereon;
 a primary lead terminal;
 a secondary lead terminal electrically isolated from the primary lead terminal;
 a primary bonding wire electrically connecting the chips of the primary chip stack to the primary lead terminal; and
 a secondary bonding wire electrically connecting the chips of the secondary chip stack to the secondary lead terminal.

12. The device of claim 11, wherein at least one of the chips of the primary and/or secondary chip stacks are provided on opposite surfaces of the substrate.

13. The device of claim 1, further comprising:
 a molding compound that encapsulates the primary and secondary chip stacks.

14. A data storage device, comprising:
 a plurality of multi-chip packages, each of the plurality of multi-chip packages comprising a primary chip stack and a secondary chip stack having fewer memory chips than the primary chip stack,
 wherein the primary chip stacks each define a logical package addressable by a memory controller, and wherein the secondary chip stacks collectively define an additional logical package addressable by the memory controller.

15. The data storage device of claim 14, wherein the additional logical package consists of a same number of memory chips as at least one of the primary chip stacks.

16. The data storage device of claim 14, wherein each of the plurality of multi-chip packages comprises:
 a package substrate including the primary and secondary chip stacks on a first surface thereof;
 a first plurality of electrical terminals on a second surface of the package substrate opposite the first surface; and
 a second plurality of electrical terminals on the second surface of the package substrate,
 wherein the chips of the primary chip stack are electrically connected to ones of the first plurality of electrical terminals, and wherein the chips of the secondary chip stack are electrically connected to ones of the second plurality of electrical terminals.

17. The data storage device of claim 16, further comprising:
 a motherboard including the plurality of multi-chip packages thereon, wherein the motherboard includes conductive traces configured to electrically connect corresponding ones of the second plurality of electrical terminals of each of the plurality of multi-chip packages to collectively define the additional logical package.

18. The data storage device of claim 17, further comprising:
 a memory controller configured to individually address the memory chips of the primary chip stack in each of the plurality of multi-chip packages, and configured to individually address the memory chips of the additional logical package collectively defined by the secondary chip stacks.

19. The data storage device of claim 18, wherein the controller is configured to individually address the memory chips of each primary chip stack and individually address the memory chips of the additional logical package using n address bits, wherein each of the primary chip stacks includes $2^n$ memory chips, and wherein each of the secondary chip stacks includes $2^n-1$ memory chips or less.

20. The data storage device of claim 19, further comprising:
 at least one additional multi-chip package, the additional multi-chip package comprising a chip stack including the same number of memory chips as each primary chip stack such that the memory chips of the additional multi-chip package are addressable using the n address bits.

21. A packaged integrated circuit device, comprising:
 a primary chip stack comprising memory chips therein that define a logical package addressable by a memory controller; and
 a secondary chip stack comprising fewer memory chips than the primary chip stack,
 wherein the memory chips of the secondary chip stack are configured to be electrically connected to memory chips of at least one external device package to define an additional logical package addressable by the memory controller,
 and wherein the memory chips of the secondary chip stack are disposed on the memory chips of the primary chip stack.

* * * * *